(12) United States Patent
Li et al.

(10) Patent No.: US 9,835,311 B2
(45) Date of Patent: Dec. 5, 2017

(54) LIGHT SOURCE ASSEMBLY, BACKLIGHT MODULE AND DISPLAY DEVICE

(71) Applicant: Hisense Electric Co., Ltd., Qingdao (CN)

(72) Inventors: Fulin Li, Qingdao (CN); Mingsheng Qiao, Qingdao (CN); Zhicheng Song, Qingdao (CN)

(73) Assignees: HISENSE ELECTRIC CO., LTD., Qingdao (CN); HISENSE USA CORPORATION, Suwanee, GA (US); HISENSE INTERNATIONAL CO., LTD., Qingdao (CN)

( * ) Notice: Subject to any disclaimer, the term of this patent is extended or adjusted under 35 U.S.C. 154(b) by 237 days.

(21) Appl. No.: 14/744,231

(22) Filed: Jun. 19, 2015

(65) Prior Publication Data

US 2016/0215940 A1 Jul. 28, 2016

(30) Foreign Application Priority Data

Jan. 22, 2015 (CN) .......................... 2015 1 0034008

(51) Int. Cl.
*H01L 33/00* (2010.01)
*F21V 9/16* (2006.01)
*H01L 33/50* (2010.01)

(52) U.S. Cl.
CPC .............. *F21V 9/16* (2013.01); *H01L 33/507* (2013.01); *H01L 33/502* (2013.01)

(58) Field of Classification Search
CPC ......... H01L 33/507; H01L 33/502; F21V 9/16
See application file for complete search history.

(56) References Cited

U.S. PATENT DOCUMENTS

| 2012/0113672 A1* | 5/2012 | Dubrow ................. | B82Y 20/00 362/602 |
| 2015/0214445 A1* | 7/2015 | Qiu ......................... | H01L 27/15 257/88 |
| 2015/0219822 A1* | 8/2015 | Lee ....................... | G02B 6/0023 362/608 |
| 2015/0226904 A1* | 8/2015 | Bae ....................... | G02B 6/0086 362/608 |
| 2016/0091657 A1* | 3/2016 | Yang ................. | G02F 1/133615 362/608 |
| 2016/0341874 A1* | 11/2016 | Fan ....................... | G02B 6/0091 |

* cited by examiner

*Primary Examiner* — Victor A Mandala
(74) *Attorney, Agent, or Firm* — Harness, Dickey & Pierce, P.L.C.

(57) ABSTRACT

The disclosure discloses a light source assembly, a backlight module and a display device and relates to the field of display technologies, and the light source assembly includes a printed circuit board, an LED chip, and a glass tube in which a quantum dot material is filled, wherein a concave groove, on the bottom of which the LED chip is arranged, is arranged on the surface of the printed circuit board, a part or all of the glass tube is accommodated in the concave groove, and the glass tube is fixed in the concave groove.

20 Claims, 2 Drawing Sheets

LIGHT SOURCE ASSEMBLY, BACKLIGHT MODULE AND DISPLAY DEVICE

CROSS-REFERENCE TO RELATED APPLICATION

This application claims the benefit and priority of Chinese Patent Application No. 201510034008.4 filed Jan. 22, 2015. The entire disclosure of the above application is incorporated herein by reference.

FIELD

The present disclosure relates to the field of display technologies and particularly to a light source assembly, a backlight module and a display device.

BACKGROUND

This section provides background information related to the present disclosure which is not necessarily prior art.

Waterproofing and oxygen-proofing is required for a quantum dot material which is not resistant to high temperature, so the quantum dot material applied to a light source assembly or a backlight module is typically encapsulated in a glass tube or a water or oxygen-proofing film.

SUMMARY

This section provides a general summary of the disclosure, and is not a comprehensive disclosure of its full scope or all of its features.

Some embodiments of the disclosure provide a light source assembly including a printed circuit board, an LED chip, and a glass tube in which a quantum dot material is filled, wherein a concave groove, on a bottom of which the LED chip is arranged, is arranged on a surface of the printed circuit board, a part or all of the glass tube is accommodated in the concave groove, and the glass tube is fixed in the concave groove.

Some embodiments of the disclosure provide a backlight module including a light source assembly including a printed circuit board, an LED chip, and a glass tube in which a quantum dot material is filled, wherein a concave groove, on a bottom of which the LED chip is arranged, is arranged on a surface of the printed circuit board, a part or all of the glass tube is accommodated in the concave groove, and the glass tube is fixed in the concave groove.

Some embodiments of the disclosure provide a display device including a backlight module including a light source assembly including a printed circuit board, an LED chip, and a glass tube in which a quantum dot material is filled, wherein a concave groove, on a bottom of which the LED chip is arranged, is arranged on a surface of the printed circuit board, a part or all of the glass tube is accommodated in the concave groove, and the glass tube is fixed in the concave groove.

Further aspects and areas of applicability will become apparent from the description provided herein. It should be understood that various aspects of this disclosure may be implemented individually or in combination with one or more other aspects. It should also be understood that the description and specific examples herein are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Figure 1:
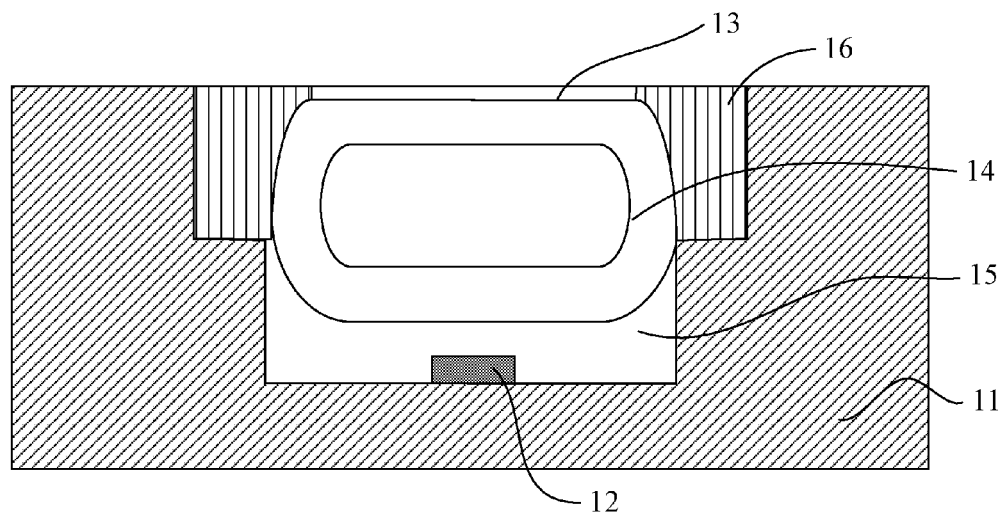
FIG. 1 illustrates a schematic sectional view of a light source assembly according to some embodiments of the disclosure.

Example embodiments will now be described more fully with reference to the accompanying drawings.

In the description of the disclosure, it shall be appreciated that the terms "up", "down", "top", "bottom", "inside", "outside", etc., indicate oriented or positional relationships which are based upon oriented or positional relationships illustrated in the drawings, and are merely intended to facilitate and simplify the description of the disclosure but not to indicate or suggest that devices or elements as they refer to must be provided in particular orientations and constructed and operating in particular orientations, so they shall not be constructed as limiting the disclosure.

The terms "first", "second", etc., are merely intended for the purpose of a description but shall not be interpreted as indicating or suggesting relative importance or implicitly stating the number of technical features they refer to. Thus features defined by "first", "second", etc., may explicitly or implicitly include one or more of the features. In the description of the disclosure, "more than one" refers to two or more unless stated otherwise.

In the description of the disclosure, it shall be noted that the terms "installed", "connected", "connect", etc., shall be broadly interpreted unless explicitly stated or defined, e.g., permanently connected or removably connected or integrally connected; or connected directly or connected indirectly through an intermediate medium or connected inside two elements. Those ordinarily skilled in the art may appreciate particular meanings of the terms above in the specification in particular contexts.

In the related art, a quantum dot material is typically encapsulated in a glass tube fixed by a holder. However there are at least the following problems when the glass tube in which the quantum dot material is encapsulated is fixed by the holder: an LED chip is arranged on a printed circuit board, and the glass tube is further arranged above the LED chip, thus the frame of the light source assembly is thicker; and moreover the LED chip is arranged directly on the printed circuit board, and an encapsulating structure is arranged on the LED chip, so that there is such a long distance of the glass tube from the LED chip that light rays emitted by the LED chip, particularly light rays incident at a large angle may be irradiated onto the encapsulating structure of the LED chip and further enter the glass tube, in which the quantum dot material is filled, after being reflected by the encapsulating structure, where a part of blue light may be lost when the light rays are reflected by the LED encapsulating structure, thus resulting in a low optical efficiency.

Figure 2:
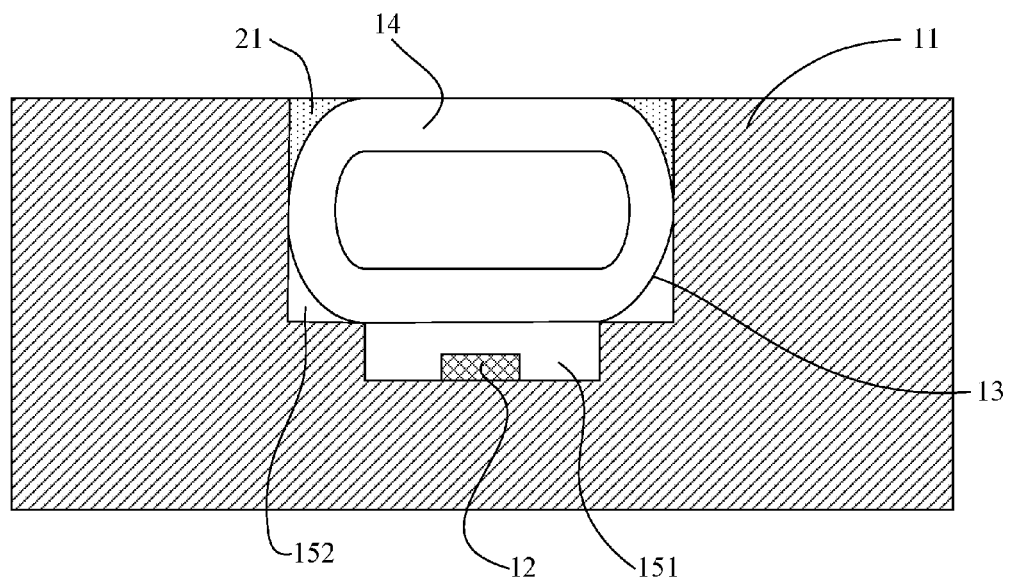
FIG. 2 illustrates a schematic sectional view of another light source assembly according to some embodiments of the disclosure.

Referring to FIG. 1 and FIG. 2, some embodiments of the disclosure provide a light source assembly including a Printed Circuit Board (PCB) 11, an LED chip 12, and a glass tube 13, where a quantum dot material 14 is filled in the glass tube 13, a concave groove 15, on the bottom of which the LED chip 12 is arranged, is arranged on the surface of the printed circuit board 11, a part or all of the glass tube 13 is accommodated in the concave groove 15, and the glass tube 13 is fixed in the concave groove 15.

In the light source assembly according to some embodiments of the disclosure, the concave groove 15 is arranged on the surface of the PCB 11, and the LED chip 12 is arranged on the bottom of the concave groove 15, that is, the LED chip 12 is arranged inside the PCB 11 instead of being arranged on the surface of the PCB 11, so the LED chip 12 will not be encapsulated, thus resulting in a lower overall thickness of the light source assembly; and the glass tube 13 in which the quantum dot material 14 is filled is accommodated in the concave groove 15, a part or all of the glass tube 13 is accommodated in the concave groove 15, and the glass tube 13 is fixed in the concave groove 15, and the glass tube 13 is arranged directly above the LED chip 12, so that when the blue light emitted from the LED chip 12 is irradiated onto the quantum dot material 14 in the glass tube 13, the concave groove 15 may function as an optical mixing cavity for the light emitted by the LED chip 12; and the glass tube 13 is arranged directly above the LED chip 12 without the encapsulating structure, so that there is such a short distance of the glass tube 13 from the LED chip 12 that all the light rays emitted by the LED chip 12 may enter directly the glass tube 13 for excitation to thereby avoid the blue light from being absorbed by the LED encapsulating structure so as to alleviate a loss of the light emitted from the LED chip 12 to thereby improve the optical efficiency of the blue light.

In some embodiments of the disclosure, the glass tube 13 may be fixed in the concave groove 15 by a bracket 16. The bracket 16 may make the glass tube 13 fixed in the concave groove 15 more firmly. For example, the bracket 16 may include two components arranged respectively on two sides of the glass tube 13.

In some other embodiments of the disclosure, the glass tube 13 may be adhesively fixed in the concave groove 15 by an adhesive 21. a smaller space will be occupied to thereby facilitate a lower overall thickness of the light source assembly.

In some embodiments of the disclosure, the concave groove 15 may include a first sub-concave groove 151 and a second sub-concave groove 152, where the second sub-concave groove 152 may be arranged above and communicated with the first sub-concave groove 151, and the bottom area and/or the volume of the second sub-concave groove 152 may be larger than the bottom area and/or the volume of the first sub-concave groove 151; and the glass tube 13 may be accommodated in the second sub-concave groove 152, and the LED chip 12 may be accommodated in the first sub-concave groove 151. Thus the first sub-concave groove 151 may be opened smaller as long as the LED chip 12 may be accommodated therein, while the second sub-concave groove 152 may be opened larger, thus resulting in such a high structural strength of the PCB 11 that the PCB 11 will not be easily deformed.

In some embodiments of the disclosure, the bracket 16 may be a plastic bracket with reflectivity larger than or equal to 93% and endurable temperature higher than or equal to 110 degrees centigrade; and the bracket 16 may be fitted to the glass tube 13 on the contact face of the glass tube 13. The reflecting and thermally enduring plastic bracket has a light weight and a high strength; and when the blue light is emitted by the LED chip 12, if the blue light overflows out of the glass tube 13, the reflecting plastic bracket may excite the blue light again, and the thermally enduring plastic bracket may endure higher temperature than 110 degrees centigrade despite the high temperature of the glass tube 13, so that the performance of the plastic bracket will be more stable and reliable instead of failing or being formed.

In some embodiments of the disclosure, a transmittive material may be filled in the concave groove 15, and between the glass tube 13 and the concave groove 15. The penetrative material may be silicon gel or another curable material with good transmittance. The light rays emitted by the LED chip 12 into the glass tube 13 may overflow, and the plastic bracket may reflect the blue light overflowing from the wall of the glass tube 13 to thereby excite the quantum dot material 13 again so as to generate white light.

In some embodiments of the disclosure, silicon gel or another material may be filled between the concave groove 15 and the LED chip 12, so that on one hand, the glass tube 13 may be fixed; and on the other hand, silicon gel is highly transmittive to thereby facilitate an improved utilization ratio of the light.

Here the adhesive 21 may be reflective white adhesive. Since the white adhesive is highly reflective, the utilization ratio of the light may be improved.

Figure 3:
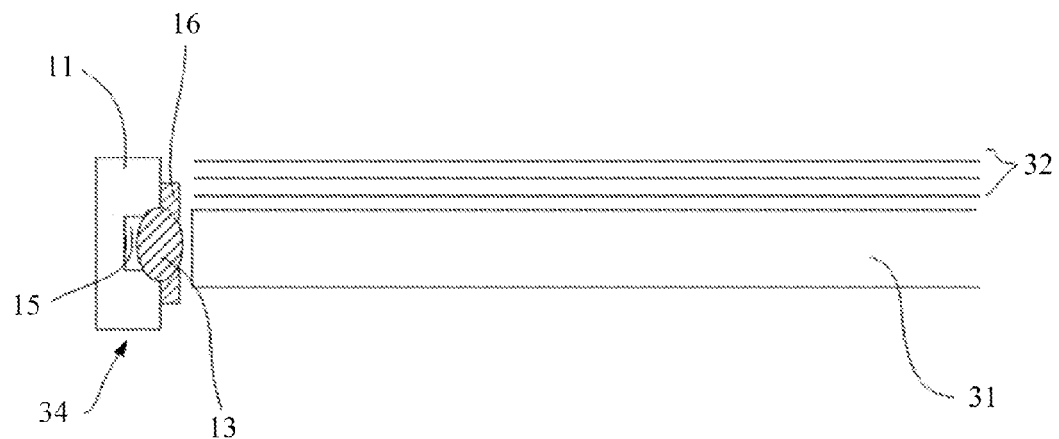
FIG. 3 illustrates a schematic sectional view of a backlight module according to some embodiments of the disclosure.

Referring to FIG. 3, some embodiments of the disclosure further provide a backlight module including the light source assembly 34. The backlight module may include a light guiding plate 31 and a set of films 32, and since the light source assembly 34 above is arranged in the backlight module, the concave groove 15 is arranged on the surface of the PCB 11 in the light source assembly 34, and the LED chip 12 is arranged on the bottom of the concave groove 15, that is, the LED chip 12 is arranged inside the PCB 11 instead of being arranged on the surface of the PCB 11, so the LED chip 12 will not be encapsulated, thus resulting in a lower overall thickness of the light source assembly 34; and the glass tube 13 in which the quantum dot material 14 is filled is partially or wholly accommodated in the concave groove 15, and the glass tube 13 is fixed in the concave groove 15, and arranged directly above the LED chip 12, so that when the blue light emitted from the LED chip 12 is irradiated onto the quantum dot material 14 in the glass tube 13, the PCB 11 is provided with the concave groove 15 which may function as an optical mixing cavity for the light emitted by the LED chip 12, so only little or no blue light will be reflected on the surface of the glass tube 13, so that there will be no loss of the overflowing light emitted from the LED chip 12 to thereby improve the utilization ratio of the blue light rays.

In some embodiments of the disclosure, the glass tube in the backlight module is fixed in the concave groove by a bracket.

In some embodiments of the disclosure, the glass tube in the backlight module is adhesively fixed in the concave groove by an adhesive.

In some embodiments of the disclosure, the concave groove in the backlight module includes a first sub-concave groove and a second sub-concave groove, where the second sub-concave groove is arranged above and communicated with the first sub-concave groove, and the bottom area of the second sub-concave groove is larger than the bottom area of the first sub-concave groove, and the glass tube is accommodated in the second sub-concave groove.

In some embodiments of the disclosure, the bracket in the backlight module is a reflective and thermally enduring plastic bracket with reflectivity larger than or equal to 93% and endurable temperature higher than or equal to degrees centigrade.

In some embodiments of the disclosure, a transmittive material is filled in the concave groove in the backlight module, and between the glass tube and the concave groove.

In some embodiments of the disclosure, the transmittive material in the backlight module is silicon gel.

In some embodiments of the disclosure, the adhesive in the backlight module is reflective white adhesive.

It shall be noted that in some embodiments of the disclosure, the light source assembly in the backlight module may be embodied as the light source assembly in the embodiment above, so reference may be made to the relevant description of the light source assembly in the embodiment above.

Figure 4:
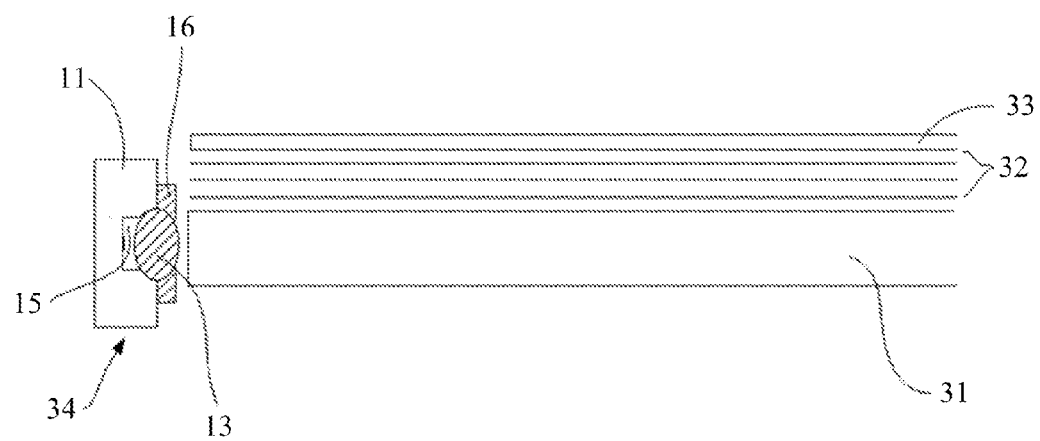
FIG. 4 illustrates a schematic sectional view of a display device according to some embodiments of the disclosure.

Referring to FIG. 4, some embodiments of the disclosure further provide a display device including the backlight module, and moreover the display device may further include a panel 33. The backlight module in the display device may include a PCB, a concave groove is arranged on the surface of the PCB, and an LED chip is arranged on the bottom of the concave groove, that is, the LED chip is arranged inside the PCB instead of being arranged on the surface of the PCB, so the LED chip will not be encapsulated, thus resulting in a lower overall thickness of the light source assembly; and a glass tube is partially or wholly accommodated in the concave groove, and the glass tube is fixed in the concave groove, and the glass tube arranged directly above the LED chip, so that when the blue light emitted from the LED chip is irradiated onto the quantum dot material in the glass tube, the PCB is provided with the concave groove which may function as an optical mixing cavity for the light emitted by the LED chip, so only little or no blue light will be reflected on the surface of the glass tube, so that there will be no loss of the overflowing light emitted from the LED chip to thereby improve the utilization ratio of the blue light rays.

It shall be noted that in some embodiments of the disclosure, the display device may include the backlight module in the embodiment above, and the light source assembly in the backlight module may be embodied as the light source assembly in the embodiment above, that is, in some embodiments of the disclosure, the light source assembly in the display device may include substantially the same structural and/or functional features as the light source assembly in the embodiment above, so reference may be made to the relevant description of the light source assembly in the embodiment above.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The invention claimed is:

1. A light source assembly, comprising:
a printed circuit board;
an LED chip; and
a glass tube in which a quantum dot material is filled, a surface of the printed circuit board sunken inward to form a concave groove having a bottom and sidewalls, the LED chip arranged on the bottom of the concave groove, a part or all of the glass tube accommodated in the concave groove, and the glass tube fixed on the sidewalls of the concave groove.

2. The light source assembly of claim 1, wherein the glass tube is fixed on the sidewalls of the concave groove by a bracket.

3. The light source assembly of claim 2, wherein the bracket is arranged between the glass tube and the sidewalls of the concave groove.

4. The light source assembly of claim 1, wherein the glass tube is adhesively fixed on the sidewalls of the concave groove by an adhesive.

5. The light source assembly of claim 4, wherein the adhesive is reflective white adhesive.

6. The light source assembly of claim 1, wherein the concave groove comprises a first sub-concave groove and a second sub-concave groove, wherein the second sub-concave groove is arranged above and communicated with the first sub-concave groove, and a bottom area of the second sub-concave groove is larger than a bottom area of the first sub-concave groove, and the glass tube is accommodated in the second sub-concave groove.

7. The light source assembly of claim 6, wherein the glass tube is fixed on sidewalls of the second sub-concave groove by a bracket, and the bracket is arranged between the glass tube and the sidewalls of the second sub-concave groove.

8. The light source assembly of claim 6, wherein the glass tube is adhesively fixed on sidewalls of the second sub-concave groove by an adhesive, and the adhesive is arranged between the glass tube and the sidewalls of the second sub-concave groove.

9. The light source assembly of claim 2, wherein the bracket is a reflective and thermally enduring plastic bracket with reflectivity larger than or equal to 93% and endurable temperature higher than or equal to 110 degrees centigrade.

10. A backlight module, comprising:
a light source assembly comprising:
a printed circuit board;
an LED chip; and
a glass tube in which a quantum dot material is filled, a surface of the printed circuit board sunken inward to form a concave groove having a bottom and sidewalls, the LED chip arranged on the bottom of the concave groove, a part or all of the glass tube accommodated in the concave groove, and the glass tube fixed on the sidewalls of the concave groove.

11. The backlight module of claim 10, wherein the bracket is arranged between the glass tube and the sidewalls of the concave groove.

12. The backlight module of claim 10, wherein the glass tube is fixed on the sidewalls of the concave groove by a bracket.

13. The backlight module of claim 12, wherein the bracket is a reflective and thermally enduring plastic bracket with reflectivity larger than or equal to 93% and endurable temperature higher than or equal to 110 degrees centigrade.

14. The backlight module of claim 10, wherein the glass tube is adhesively fixed on the sidewalls of the concave groove by an adhesive.

15. The backlight module of claim 14, wherein the adhesive is reflective white adhesive.

16. The backlight module of claim 10, wherein the concave groove comprises a first sub-concave groove and a second sub-concave groove, wherein the second sub-concave groove is arranged above and communicated with the first sub-concave groove, and a bottom area of the second sub-concave groove is larger than a bottom area of the first sub-concave groove, and the glass tube is accommodated in the second sub-concave groove.

17. A display device, comprising:
a backlight module comprising:
a light source assembly comprising:
a printed circuit board;
an LED chip; and
a glass tube in which a quantum dot material is filled, a surface of the printed circuit board sunken inward to form a concave groove having a bottom and sidewalls, the LED chip arranged on the bottom of the concave groove, a part or all of the glass tube accommodated in the concave groove, and the glass tube fixed on the sidewalls of the concave groove.

18. The display device of claim 17, wherein the glass tube is fixed on the sidewalls of the concave groove by a bracket.

19. The display device of claim 17, wherein the glass tube is adhesively fixed on the sidewalls of the concave groove by an adhesive.

20. The display device of claim 17, wherein the concave groove comprises a first sub-concave groove and a second sub-concave groove, wherein the second sub-concave groove is arranged above and communicated with the first sub-concave groove, and a bottom area of the second sub-concave groove is larger than a bottom area of the first sub-concave groove, and the glass tube is accommodated in the second sub-concave groove.

* * * * *